United States Patent [19]

Suzuki et al.

[11] 4,255,678

[45] Mar. 10, 1981

[54] VOLTAGE SENSE CIRCUIT

[75] Inventors: Yasoji Suzuki, Ayase; Kiyofumi Ochii, Inagi; Hirozi Asahi, Zama, all of Japan

[73] Assignee: Tokyo Shibaura Denki Kabushiki Kaisha, Japan

[21] Appl. No.: 962,221

[22] Filed: Nov. 20, 1978

[30] Foreign Application Priority Data

Nov. 21, 1977 [JP] Japan ................................ 52-139585

[51] Int. Cl.³ .......................... H03K 5/24; G11C 7/00
[52] U.S. Cl. ............................. 307/355; 307/DIG. 3; 365/190; 365/203; 365/205
[58] Field of Search ............... 307/279, 291, 355, 362, 307/356, DIG. 3; 365/190, 196, 202, 203, 205, 207, 208

[56] References Cited

U.S. PATENT DOCUMENTS

| | | | |
|---|---|---|---|
| 3,457,435 | 7/1969 | Burns et al. | 307/251 |
| 3,588,537 | 6/1971 | Brink | 307/DIG. 3 X |
| 3,879,621 | 4/1975 | Cavaliere et al. | 365/207 X |
| 4,031,524 | 6/1977 | Heeren | 365/202 X |
| 4,061,954 | 12/1977 | Proebsting et al. | 365/203 X |
| 4,085,457 | 4/1978 | Itoh | 307/DIG. 3 X |
| 4,096,401 | 6/1978 | Hollingsworth | 307/DIG. 3 X |
| 4,123,799 | 10/1978 | Peterson | 307/DIG. 3 X |
| 4,131,951 | 2/1978 | Asashi | 365/203 |
| 4,138,740 | 2/1979 | Itoh | 365/203 |

FOREIGN PATENT DOCUMENTS 467403  7/1975  U.S.S.R. ........................... 307/DIG. 3

OTHER PUBLICATIONS

Arzubi, "Sense Amplifiers for Capacitive Storage", *IBM Tech. Discl. Bull.*, vol. 19, No. 2, pp. 407–408, 7/1976.

Furman et al., "Sense Latch Circuit for Memory Cells", *IBM Tech. Discl. Bull.*, vol. 16, No. 9, pp. 2792–2793, 2/1974.

"Examination on the CMOS Sense Amplifier", *Publication of the Electronics Communication Society*, (Japan), 8/1977.

*Primary Examiner*—Larry N. Anagnos
*Attorney, Agent, or Firm*—Finnegan, Henderson, Farabow, Garrett & Dunner

[57] ABSTRACT

A voltage sense circuit in which first and second parallel connections of complementary MOS transistors are connected between a pair of signal lines connected to memory cells and outputs of a flip-flop circuit for detecting a potential change of the signal line caused by data readout from an accessed memory cell. MOS transistors of one channel type in the parallel connections are adapted to precharge output node capacitors of the flip-flop circuit to a supply voltage level, while MOS transistors of the other channel type are adapted to couple complementary output voltage levels of the flip-flop circuit produced after the data readout and operation of the flip-flop circuit to the signal lines. Use of the parallel connections of complementary MOS transistors enables the application of a single power source for producing gate signals of these MOS transistors.

3 Claims, 4 Drawing Figures

VOLTAGE SENSE CIRCUIT

BACKGROUND OF THE INVENTION

This invention relates to a voltage sense circuit, and more particularly, to a circuit capable of sensing at a high speed a potential difference variation which develops between a pair of signal lines.

FIG. 1 shows a prior art voltage sense circuit of a RAM (randon access memory) composed of MOS transistors. In this voltage sense circuit, a pair of data lines 11 and 12 connected to memory cells included in the same column of a semiconductor memory array are connected to a power source $V_{DD}$ through p-channel MOS transistors T1 and T2 respectively. The transistors T1 and T2 are caused to conduct by a low-level (ground-level) chip enable signal CE, thereby precharging stray capacitances C1 and C2 associated with the data lines 11 and 12 to $+V_{DD}$.

The data lines 11 and 12 are connected to output nodes 14 and 15 of a flip-flop circuit 13 through n-channel transistors T6 and T7 respectively, and have stray capacitors C3 and C4 between the source electrodes of the transistors T6 and T7 and ground respectively. The transistors T6 and T7 are adapted to precharge the output node capacitors C3 and C4 of the flip-flop circuit 13 to $+V_{DD}(+5\ V)$ during the precharge period and to transmit to the output node capacitor C3 or C4 a potential change of the data line 11 or 12, which is caused by a data readout from an accessed memory cell of the memory cells connected to the data lines 11 and 12 and having the same Y-address, after the precharge period. To this end, the respective gate electrodes of the transistors T6 and T7 are supplied with a timing signal $\phi_1$ having voltage levels of $+8$ V and $+5$ V as shown in FIG. 2. If the timing signal $\phi_1$ is held at $+5$ V equivalent to the supply voltage $+V_{DD}$ during the precharge period, it is impossible to charge the stray capacitors C3 and C4 to $+V_{DD}$. The capacitors C3 and C4 can be fully charged to $+5$ V by applying $+8$ V to the gate electrodes of the transistors T6 and T7.

After the precharge period, a memory cell is accessed, whereby the potential of one of the data lines 11 and 12 is somewhat lowered. This potential change is transmitted to the node capacitor C3 or C4 during a period of time when the timing signal $\phi_1$ maintains $+8$ V. Consequently, the voltage across one of the node capacitors C3 and C4 is lowered. After the timing signal $\phi_1$ has dropped to $+5$ V, the transistors T6 and T7 are turned off because the source-to-gate voltage of the transistors T6 and T7 becomes lower than the threshold voltage.

When a timing signal $\phi_2$ applied to the gate electrode of a transistor T5 beccomes a HIGH level $(+V_{DD})$, as shown in FIG. 2, the transistor T5 is turned on. As a result, a node capacitor holding a voltage lower than the supply voltage $+V_{DD}$ discharges to the ground level.

In consequence, one of the transistors T6 and T7 which is connected to the discharged node capacitor turns on to pull down the potential reduced data line to the ground level. That is, the transistors T6 and T7 also serve to pull down rapidly to the ground level the data line to which 0 (Low level) is read out from the memory cell.

Since the aforementioned voltage sense amplifier employs n-channel transistors for the transistors T6 and T7, the gate signal $\phi_1$ requires a higher voltage level than the supply voltage $+V_{DD}$. In order to produce a voltage level higher than the supply voltage, a level shift circuit is generally incorporated in a semiconductor chip in which the memory array is formed. If the transistors T6 and T7 are each connected with an additional n-channel transistor, the timing signal $\phi_1$ may maintain the $+5$ level during the read cycle, and a timing signal applied to the additional transistors must have voltage levels of $+0$ V and $+8$ V. In this case, two power sources of $+5$ V and $+8$ V are required.

The necessity of the level shift circuit and the two power sources would render construction of the semiconductor memory complex, increasing the chip size and the number of terminals required.

SUMMARY OF THE INVENTION

The object of this invention is to provide a voltage sense circuit operating with a single power source.

This object may be attained by interposing first and second parallel connections of complementary pair of MOS transistors between a first signal line and a first output of a flip-flop circuit and between a second signal line and a second output of the flip-flop circuit, respectively.

MOS transistors of one channel type in the first and second parallel connections of MOS transistors serve to couple potentials of the first and second signal lines to the first and second outputs of the flip-flop circuit, while MOS transistors of the other channel type couple complementary output voltage levels of the flip-flop circuit after data readout to the first and second signal lines.

DETAILED DESCRIPTION OF THE PREFERRED EMBODIMENT

Figure 1:
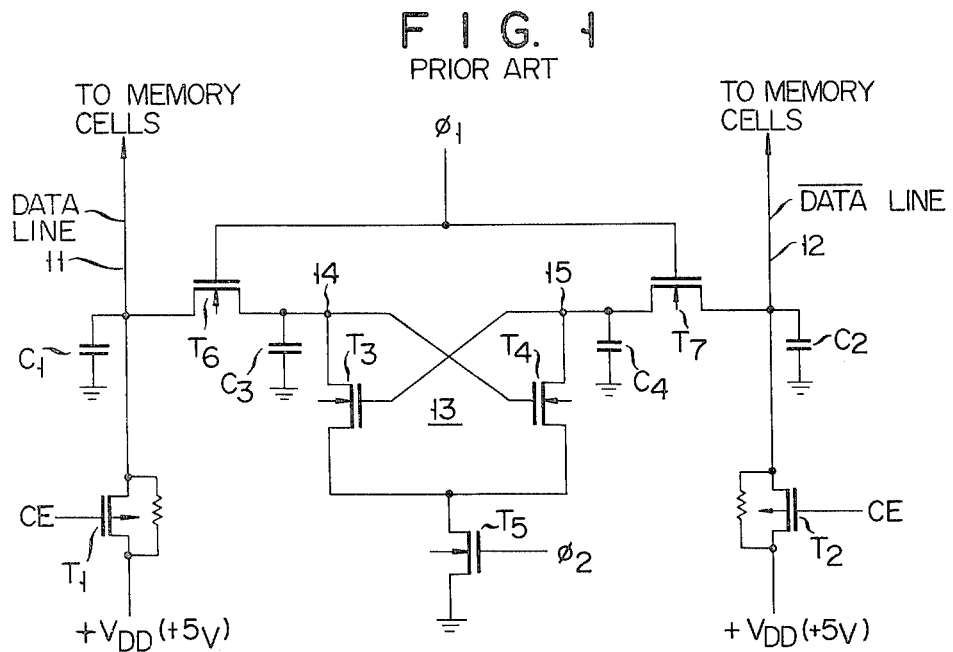
FIG. 1 is a circuit diagram of a prior art voltage sense circuit.
Figure 2:
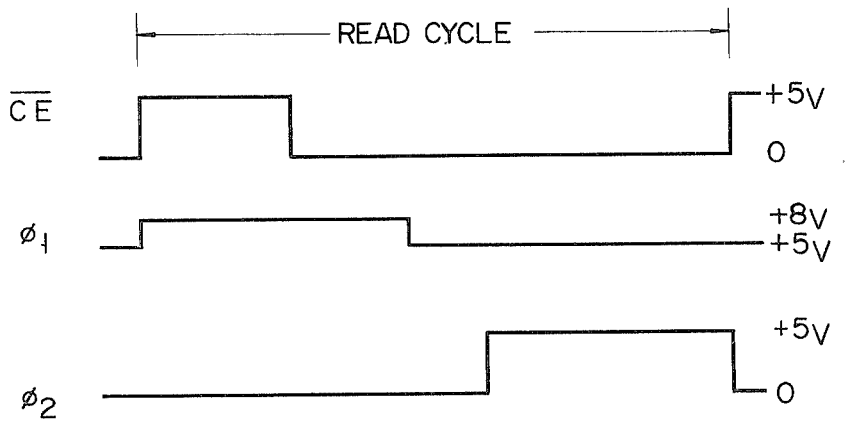
FIG. 2 is a time chart useful in explaining the operation of the circuit of FIG. 1.
Figure 3:
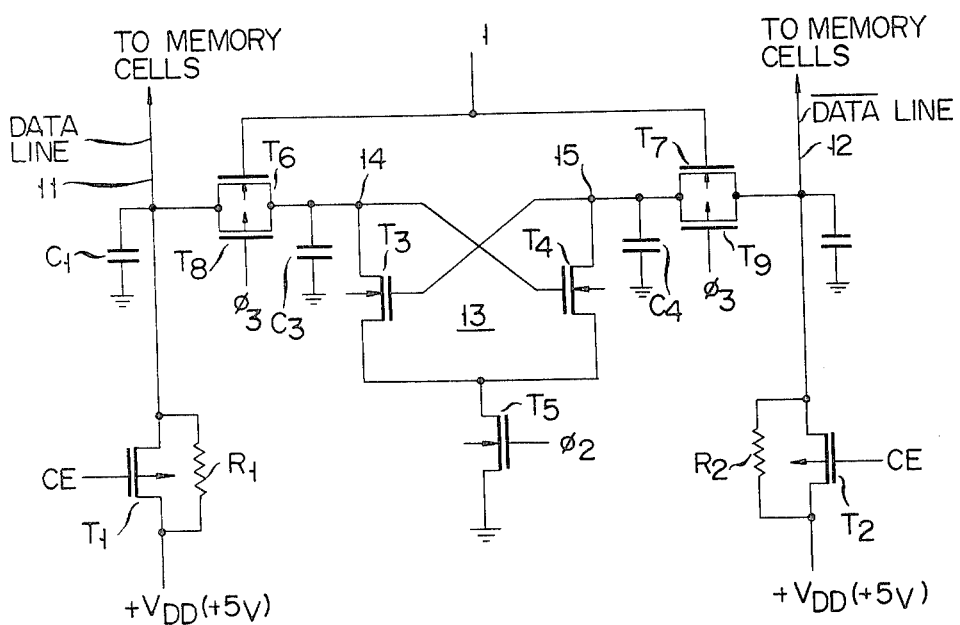
FIG. 3 is a circuit diagram of a voltage sense circuit according to this invention.

Referring now to FIG. 3, there will be described a voltage sense circuit according to this invention. In FIG. 3, like reference numerals and characters are used to denote the same parts as those of FIG. 1.

DATA and $\overline{\text{DATA}}$ lines 11 and 12 connected to memory cells of a RAM with the same Y-address are connected to a power source $+V_{DD}\ (+5\ V)$ through p-channel transistors T1 and T2 to which pull-up resistors R1 and R2 are connected in parallel, respectively as required. A chip enable signal CE is applied to the gate electrodes of the transistors T1 and T2.

N-channel transistors T3 and T4 have their respective source electrodes connected to each other, and are cross-coupled with respect to the drain and gate electrodes to form a flip-flop circuit 13. The source electrodes of the transistors T3 and T4 are connected to ground through an n-channel transistor T5, the gate of which is supplied with a timing signal $\phi_2$. An output node 14 of the flip-flop circuit 13 is connected to the $\overline{\text{DATA}}$ line 11 via a parallel connection of an n-channel transistor T6 and a p-channel transistor T8, while an output node 15 of the flip-flop circuit 13 is connected to the DATA line 12 via a parallel connection of an n-channel transistor T7 and a p-channel transistor T9. A timing signal $\phi_1$ is applied to the gate electrodes of the transistors T6 and T7, and a timing signal $\phi_3$ is applied to those of the transistors T8 and T9. Stray capacitances C1 and C2 associated with the data lines 11 and 12 are larger than output node capacitances C3 and C4 of the flip-flop circuit 13.

Figure 4:
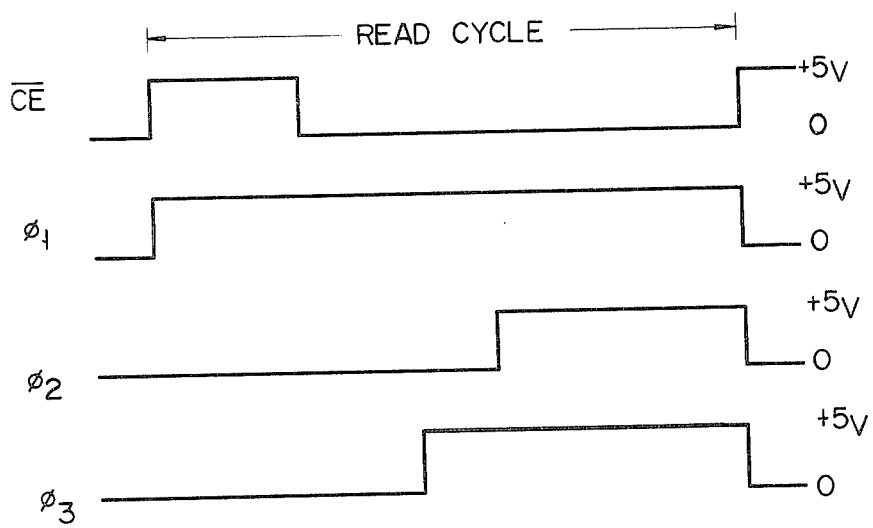
FIG. 4 is a time chart useful in explaining the operation of the circuit of FIG. 3.

In the above-mentioned circuit, the desired operation can be achieved by gate signals with only two voltage levels, 0 V and +5 V, for the transistors coupling outputs of the flip-flop circuit 13 to the data lines 11 and 12. Referring now to FIG. 4, there will be described operation of the voltage sense circuit of FIG. 3.

In an initial fixed period of the read cycle, the transistors T1 and T2 are enabled by the chip enable signal CE, whereby the capacitors C1 and C2 of the DATA and $\overline{\text{DATA}}$ lines are precharged to $+V_{DD}$. During the precharge period, the time signals $\phi_1$ and $\phi_3$ are at the $+V_{DD}$ and ground levels respectively. Accordingly, both the n-channel transistors T6 and T7 and the p-channel transistors T8 and T9 are on, so that the node capacitors C3 and C4 are precharged. When voltages of the capacitors C3 and C4 reach $+V_{DD}$ minus threshold voltage, the n-channel transistors T6 and T7 are turned off, whereas the p-channel transistors T8 and T9 are fully on, to thereby charge the capacitors C3 and C4 up to $+V_{DD}$. Since values of the capacitors C3 and C4 are smaller than those of the capacitors C1 and C2, the capacitors C3 and C4 are charged to $+V_{DD}$ prior to the capacitors C1 and C2.

After the precharge period, or the enable period of the transistors T1 and T2, one of the memory cells is accessed to read out data. Consequently, the potential of the DATA or $\overline{\text{DATA}}$ line connected to the accessed memory cell is lowered in response to readout data 0. For example, the potential of the $\overline{\text{DATA}}$ line 12 is lowered from +5 V to +4.8 V. At this point of time, the gate signal $\phi_3$ is still at 0 V, so that the transistor T9 is fully on. Therefore, the capacitor C4 discharges from +5 V to +4.8 V. The capacitor C3 maintains +5 V, since the DATA line 11 holds +5 V in response to readout data. When the gate signal $\phi_3$ is pulsed to +5 V, the transistors T8 and T9 are turned off. At this time, though the signal $\phi_1$ is still at +5 V, the transistors T6 and T7 are off since their source potentials are +5 V and +4.8 V respectively. That is to say, the read data from the accessed memory cell is stored in the capacitors C3 and C4. The data storage period continues until the gate signal $\phi_2$ of the flip-flop enable transistor T5 is pulsed from 0 V to +5 V. During the data storage period, the transistors T3 and T4 are both held on by the respective voltages (+4.8 V and +5 V) of the capacitors C4 and C3, the on resistance of the transistor T4 being smaller than that of the transistor T3. When the transistor T5 is turned on, the capacitor C4 rapidly discharges through the transistors T4 and T5. As a result, the transistor T3 is immediately turned off. Accordingly, the capacitor C4 stores substantially 0 V, while the capacitor C3 stores substantially +5 V.

Since the gate signal $\phi_1$ maintains +5 V after the signal $\phi_2$ has reached +5 V, the transistor T7 is turned on if the voltage of the capacitor C4 drops to +5 V minus threshold voltage. In consequence, the $\overline{\text{DATA}}$ line 12 discharges through the transistors T7, T4 and T5 with the result that its potential is rapidly brought down substantially to 0 V level. That is, a small change in the potential difference between the DATA and $\overline{\text{DATA}}$ lines 11 and 12 caused by data readout of a memory cell quickly becomes large enough to enable a data detection. This large change in the potential difference allows the accessed memory cell of a destructive readout type to be refreshed. The DATA and $\overline{\text{DATA}}$ lines are connected to a suitable buffer amplifier, delivering the read data to a data utilization circuit.

As described above, the parallel connections of complementary MOS transistors are used for coupling the outputs of the flip-flop circuit to a pair of signal lines connected to memory cells, so that there is no need for two power sources or for a level shift circuit for producing gate signals. The memory cells forming a RAM may be of a destructive or nondestructive readout type. The circuit of this invention may serve not only as a sense circuit for sensing data read out to the DATA and $\overline{\text{DATA}}$ lines, but as a circuit capable of rapidly changing the potential of one of the data lines in response to the data readout when using another sense circuit. By changing the polarity of the supply voltage, the channel type of each transistor can be reversed. The flip-flop circuit used in the circuit of this invention is not limited to the arrangement as illustrated.

What we claim is:

1. A voltage sense circuit for sensing potential differences between first and second signal lines connected to memory cells, each of said signal lines being first precharged to a first supply voltage level during a precharge period and the potential of one of said signal lines thereafter being subject to change by data readout from an accessed memory cell of said memory cells during a readout period after said precharge period to create a potential difference between said signal lines, the voltage sense circuit comprising:
   a flip-flop circuit having first and second outputs;
   a first parallel connection of a first complementary pair of MOS transistors of first and second channel types connected between said first output of said flip-flop circuit and said first signal line;
   a second parallel connection of a second complementary pair of MOS transistors of said first and second channel types connected between said second output of said flip-flop circuit and said second signal line;
   a flip-flop enable MOS transistor connected to said flip-flop circuit for actuating said flop-flop circuit;
   means supplying a timing signal varying between said first supply voltage and a second supply voltage level to said MOS transistors of each of said first and second channel types of said first and second parallel connections and supplying an actuation signal to said enable MOS transistor for:
      (i) holding said MOS transistors of said first channel type in an ON state to precharge said first and second outputs of said flip-flop circuit to said first supply voltage level during said precharge period, and for turning OFF said MOS transistors of said first channel type after said data readout period,
      (ii) enabling said flip-flop MOS transistor after said readout period to actuate said flip-flop circuit and thereby achieve at one of said first and second outputs said second supply voltage level in response to potentials at said first and second outputs after said potential difference occurs between said first and second signal lines, and
      (iii) holding the one of said MOS transistors of said second channel type which is coupled to the one of said first and second outputs of said flip-flop circuit that is at said second voltage supply level upon actuation of said flip-flop circuit in an ON state to discharge said signal line that is connected to said one of said MOS transistors of said second channel type.

2. The voltage sense circuit according to claim 1 wherein said first channel type is P-channel type and said second channel type is N-channel type.

3. A voltage sense circuit according to claim 1, wherein said flip-flop circuit includes MOS transistors having gate and drain electrodes cross-coupled and having source electrodes connected to said flip-flop enable MOS transistor.

* * * * *